United States Patent
Chen et al.

(10) Patent No.: US 7,723,774 B2
(45) Date of Patent: May 25, 2010

(54) NON-DIFFUSION JUNCTION SPLIT-GATE NONVOLATILE MEMORY CELLS AND ARRAYS, METHODS OF PROGRAMMING, ERASING, AND READING THEREOF, AND METHODS OF MANUFACTURE

(75) Inventors: Changyuan Chen, Sunnyvale, CA (US); Ya-Fen Lin, Saratoga, CA (US); Dana Lee, Saratoga, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 238 days.

(21) Appl. No.: 11/775,851

(22) Filed: Jul. 10, 2007

(65) Prior Publication Data

US 2009/0016113 A1    Jan. 15, 2009

(51) Int. Cl.
*H01L 29/788* (2006.01)
(52) U.S. Cl. .................. 257/315; 257/316; 257/319; 257/E21.68
(58) Field of Classification Search .................. 257/315, 257/316, 319; 365/185
See application file for complete search history.

(56) References Cited

U.S. PATENT DOCUMENTS

| | | | |
|---|---|---|---|
| 5,029,130 A | 7/1991 | Yeh | |
| 6,151,248 A | 11/2000 | Harari et al. | |
| 6,825,084 B2 | 11/2004 | Ogura et al. | |
| 2005/0243603 A1* | 11/2005 | Kobayashi et al. | 365/185.17 |

OTHER PUBLICATIONS

Y. Sasago et al, "90-nm-node Multi-level AG-AND Type Flash Memory With Cell Size of True 2-F/sup 2/bit and Programming Throughput of 10MB/s," published in the 2003 IEDM Technical Digest, pp. 34.2.1-34.2.4 (also pp. 823-826), Dec. 2003.
H. Kurata et al, "Self-boosted Charge Injection for 90-nm Node 4-GB Multilevel AG-AND Flash Memories Programmable at 16 MB/s," published in the 2004 Digest of Technical Papers—Symposium on VLSI circuits, pp. 72-73, Jun. 2004.

* cited by examiner

*Primary Examiner*—Jerome Jackson, Jr.
*Assistant Examiner*—Dale Page
(74) *Attorney, Agent, or Firm*—DLA Piper LLP (US)

(57) ABSTRACT

Nonvolatile flash memory systems and methods are disclosed having a semiconductor substrate of a first conductivity type, including non-diffused channel regions through which electron flow is induced by application of voltage to associated gate elements. A plurality of floating gates are spaced apart from one another and each insulated from the channel region. A plurality of control gates are spaced apart from one another and insulated from the channel region, with each control gate being located between a first floating gate and a second floating gate and capacitively coupled thereto to form a subcell. A plurality of spaced-apart assist gates are insulated from the channel region, with each assist gate being located between and insulated from adjacent subcells. The channel is formed of three regions, two beneath adjacent control gate elements as well as a third region between the first two and beneath an associated assist gate.

46 Claims, 19 Drawing Sheets

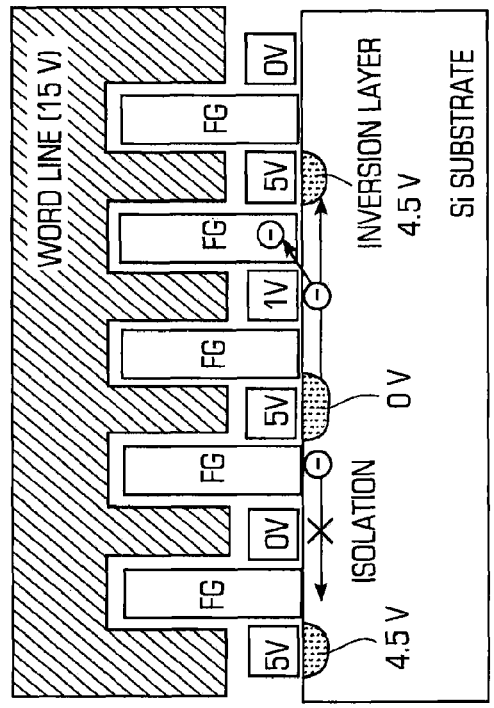
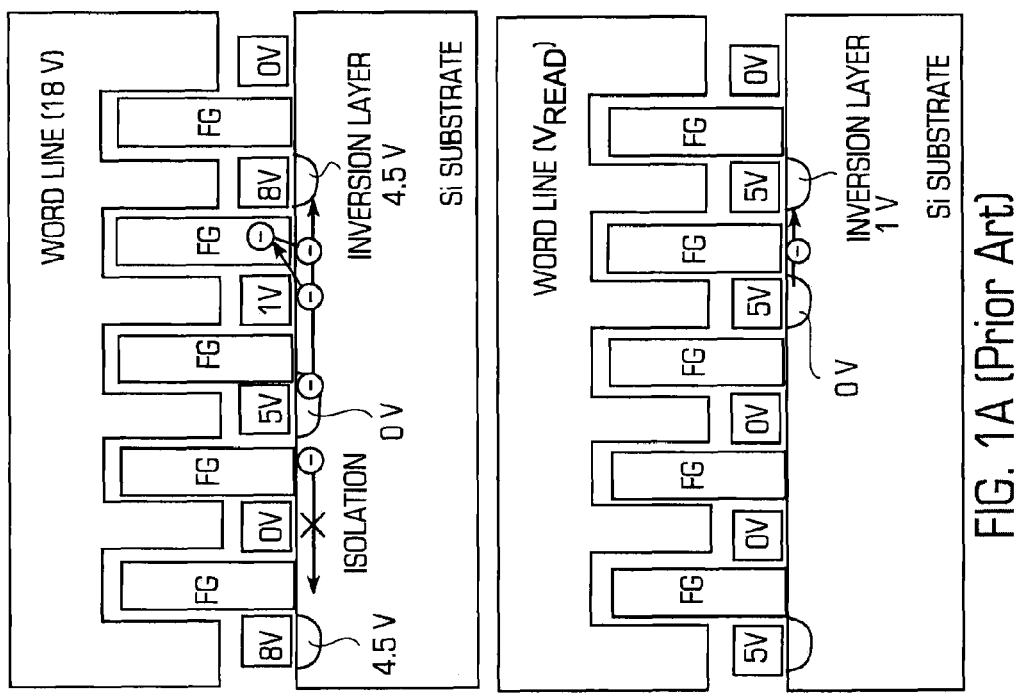
FIG. 1A (Prior Art)
FIG. 1B (Prior Art)

NON-DIFFUSION JUNCTION SPLIT-GATE NONVOLATILE MEMORY CELLS AND ARRAYS, METHODS OF PROGRAMMING, ERASING, AND READING THEREOF, AND METHODS OF MANUFACTURE

BACKGROUND

1. Field

The present invention relates to a non-diffusion-junction split-gate nonvolatile memory cell, associated arrays, as well as methods of manufacture and operation.

2. Description of Related Information

Nonvolatile memory cells having a floating gate for the storage of charges thereon to control the conduction of current in the channel region in the substrate of the semiconductive material are well known in the art. See, for example, U.S. Pat. No. 5,029,130 whose disclosure is incorporated herein by reference in its entirety. Structurally, nonvolatile memory cells using a floating gate for storage may be classified as either a stacked gate configuration or a split gate configuration. In a stacked gate, a control gate is positioned directly over the floating gate. In a split gate, the control gate has one portion over and another portion adjacent the floating gate, where the control gate controls one region of the channel and the floating gate controls another region of the channel.

In an article entitled "90-nm-node multi-level AG-AND type flash memory with cell size of true 2-F/sup 2//bit and programming throughput of 10 MB/s" by Y. Sasago et al., published in the 2003 IEDM Technical Digest, pp. 34.2.1-34.2.4 (also pp. 823-26), the authors described an AG (assist gate) AND-type array of floating gate nonvolatile memory cells. See also, the paper entitled "Self-boosted charge injection for 90-nm-node 4-Gb multilevel AG-AND flash memories programmable at 16 MB/s" by H. Kurata et. al, published in the 2004 Digest of Technical Papers—Symposium on VLSI Circuits, pp. 72-73.

AND arrays and cross-sectional views of arrays of floating gate nonvolatile memory cells disclosed in the aforementioned papers are shown on FIGS. 1A and 1B, respectively. The arrays are comprised of a plurality memory cells arranged in a plurality of rows and columns. Schematic diagrams and cross-sectional views illustrating alternating floating gate/control gate structures and associated differing voltage conditions required for operation are shown (i.e. FIG. 1A illustrates structure and voltage conditions for the program and read operations of Sasago et al., and FIG. 1B illustrates structure and voltage conditions for the program operation of Kurata et al.). However, these arrays are restricted by operation of selected control gates in association with shared floating gates, and require a wide variety of operating voltages to be maintained independently at specified values.

Many such AND arrays of the prior art are formed in a row or column direction with a bit line and a line connecting the respective control gates. One problem with these structures is that they must be fabricated to allow voltages for both the bit line and the control gate line to be set independently for each cell. With two such lines for each cell and where for nonvolatile memory cells the lines must carry high voltages, there may be excessive voltage control lines required for the pitch of each cell. In addition, such AND-type structures are often uni-directional in operation.

Memory arrays in which the adjacent rows/columns are electrically connected at ends of the array are known. See, e.g. FIG. 2 of U.S. Pat. No. 6,825,084. Additionally, control gates that are substantially T shaped positioned between a pair of floating gates and having a portion over a channel region, and capacitively coupled to the pair of floating gates are also known in the art. See e.g. U.S. Pat. No. 6,151,248. Finally, fabrication of memory cells and arrays without diffused junctions/channel regions is also known, as this can achieve desirable process simplification. Drawbacks of these structures and arrays, however, include additional or complex fabrication processes and undesired operating functionality such as higher operating voltages, restricted read operations, etc., among other disadvantages.

Accordingly, there is a need to reduce manufacturing complexity, increase cell density, increase data storage density, and improve operation of nonvolatile memory devices.

SUMMARY

In the present invention, a nonvolatile flash memory structure has a semiconductor substrate of a first conductivity type, including a non-diffused channel region through which electron flow may be induced by application of voltage to gate elements disposed above the channel region. A plurality of floating gates are spaced apart from one another and each insulated from the channel region. A plurality of control gates are spaced apart from one another and insulated from the channel region. Each control gate is located between a first floating gate and a second floating gate, and is capacitively coupled to the first floating gate and the second floating gate, wherein each control gate and pair floating gates to which the control gate is capacitively coupled form a subcell. A plurality of assist gates are spaced apart from one another and insulated from the channel region. Each assist gate is located between and insulated from floating gates from adjacent subcells. The channel region includes a first channel region beneath the first subcell, a second channel region beneath the second subcell, and a third channel region beneath the assist gate, and wherein each subcell and assist gate controls conductivity of a channel region located therebeneath.

The present invention also relates to arrays of the foregoing described nonvolatile memory cells, as well as methods of making and operating the memory cells and the arrays.

BRIEF DESCRIPTION OF THE DRAWINGS

FIGS. 1a-1b are schematic and cross-sectional views of assist gate ("AG") AND flash memory structures of the prior art.

DETAILED DESCRIPTION

Figure 2:
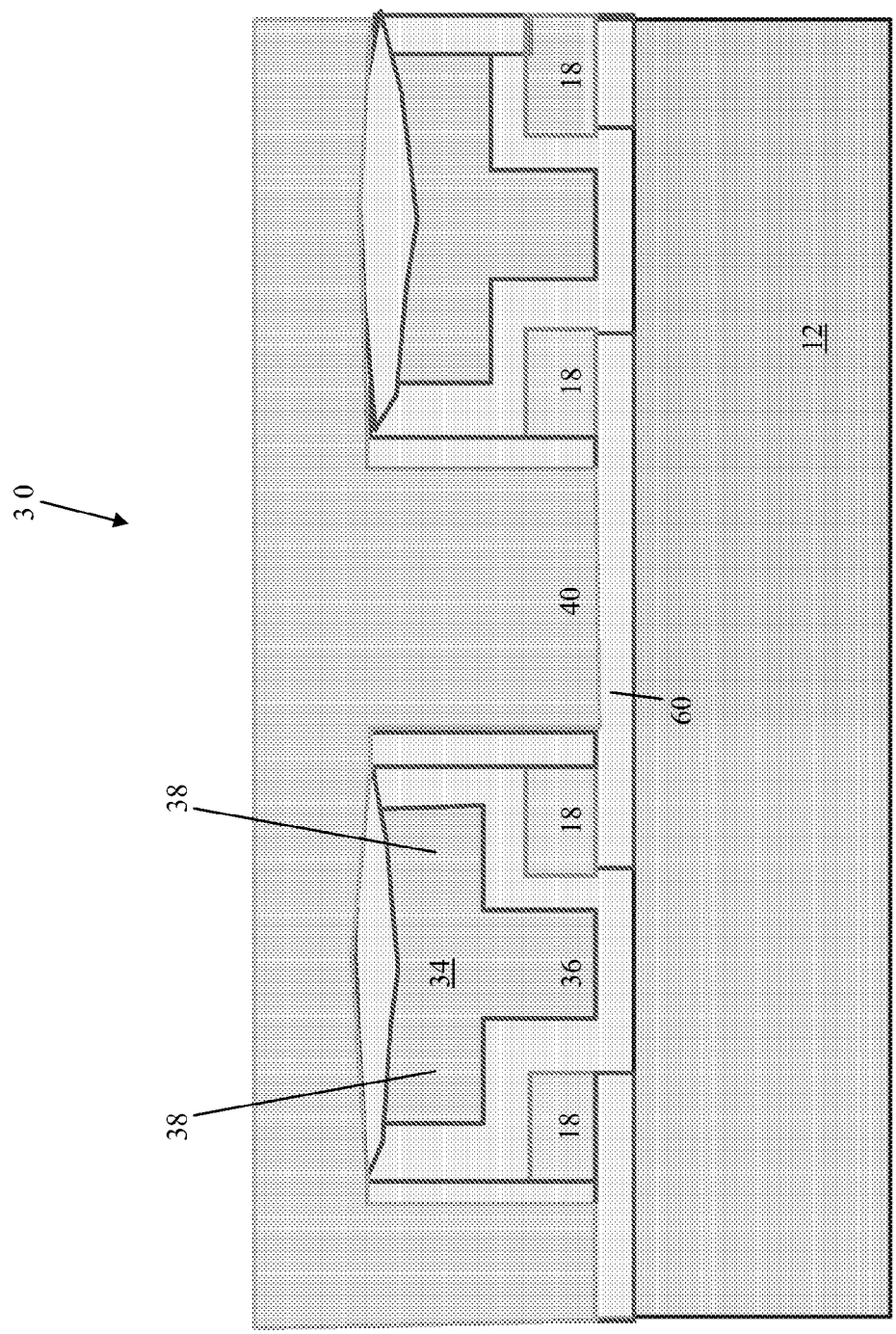
FIG. 2 is a cross-sectional view of a portion of a flash memory cell consistent with aspects related to the innovations herein.

Referring to FIG. 2, there is shown a cross-sectional view of a portion of the flash memory structure 30 of the present invention. The structure 30 comprises a silicon substrate 12, which typically is of P type. However, as it is well known to those skilled in the art, that the substrate may also be N type. Further, as is well known, the substrate 12 may be a well. The portion of the structure 30 also comprises a floating gate oxide layer 60 on the substrate 12. Each memory cell includes a pair of floating gates 18 on the oxide layer 60. An assist gate 40 is located between pairs of floating gates 18 from adjacent cells. The control gate 34 is substantially T shaped, comprised of two upper portions 38 and a lower portion 36. Each upper portion 38 extends over one floating gate 18 and is capacitively coupled thereto. The lower portion 36 of the control gate 34 is located between the pair of floating gates 18. These gate elements and underlying regions of the substrate form metal oxide semiconductor (MOS) transistor elements. Non-diffused channel regions in the substrate, described in more detail below, may act as sources and drains in the conventional sense for these transistor elements. Further, the operation of the flash memory structure 30 of the present invention can be operated with the non-diffused "source" and "drain" regions interchanged, i.e. the structure 30 can operate bi-directionally. Accordingly, as used herein, the terms "source" and "drain" may be used interchangeably.

In the present invention, diffusion regions are not implanted or otherwise explicitly formed within the substrate beneath the memory cell elements. Instead, a non-diffused channel region is used, through which electron flow may be induced by associated gate elements. A channel region between control gates is comprised of a first channel region beneath a floating gate coupled to the first control gate, a second channel region beneath a floating gate coupled to the second control gate, and a third channel region beneath the assist gate located between the two control gates. In operation, the gate elements above the substrate are supplied with a voltage sufficient to induce junctions and electron flow into the desired channel regions. Further, such virtual junctions can unify the control gates and their associated virtual nodes and eliminate the need for independent operation voltages therebetween. Although the control gate and diffusion region can operate as a unified node, a voltage may be set for the line/diffusion node by means of actual junction and contact located at the end of the bit lines. In other words, the control gate induces the junction in the array and the contact at the array edge sets the voltage for that junction.

One flash memory structure 30 of the present invention comprises a plurality of controls gates 34 that each define a subcell. Each control gate 34 is associated with and is positioned between a pair of floating gates 18. As explained above, each control gate 34 has upper and lower portions. The control gate 34 can be a unitary structure as shown in FIG. 2 or it may be formed as two or more separate portions electrically connected ex situ, i.e. electrically outside of the flash memory structure 30. In the example of FIG. 2, the flash memory structure 30 also comprises a first assist gate 40 positioned over a portion of the substrate 12 and insulated therefrom. Each assist gate 40 is also positioned between a pair of floating gates 18. Thus, each floating gate 18 has an associated control gate 34 to one side and an associated assist gate 40 to another side. The assist gates 40 function as gates of conventional MOS transistors, and may be substantially rectilinearly shaped.

Array of and Flash Memory Structures

Figure 3:
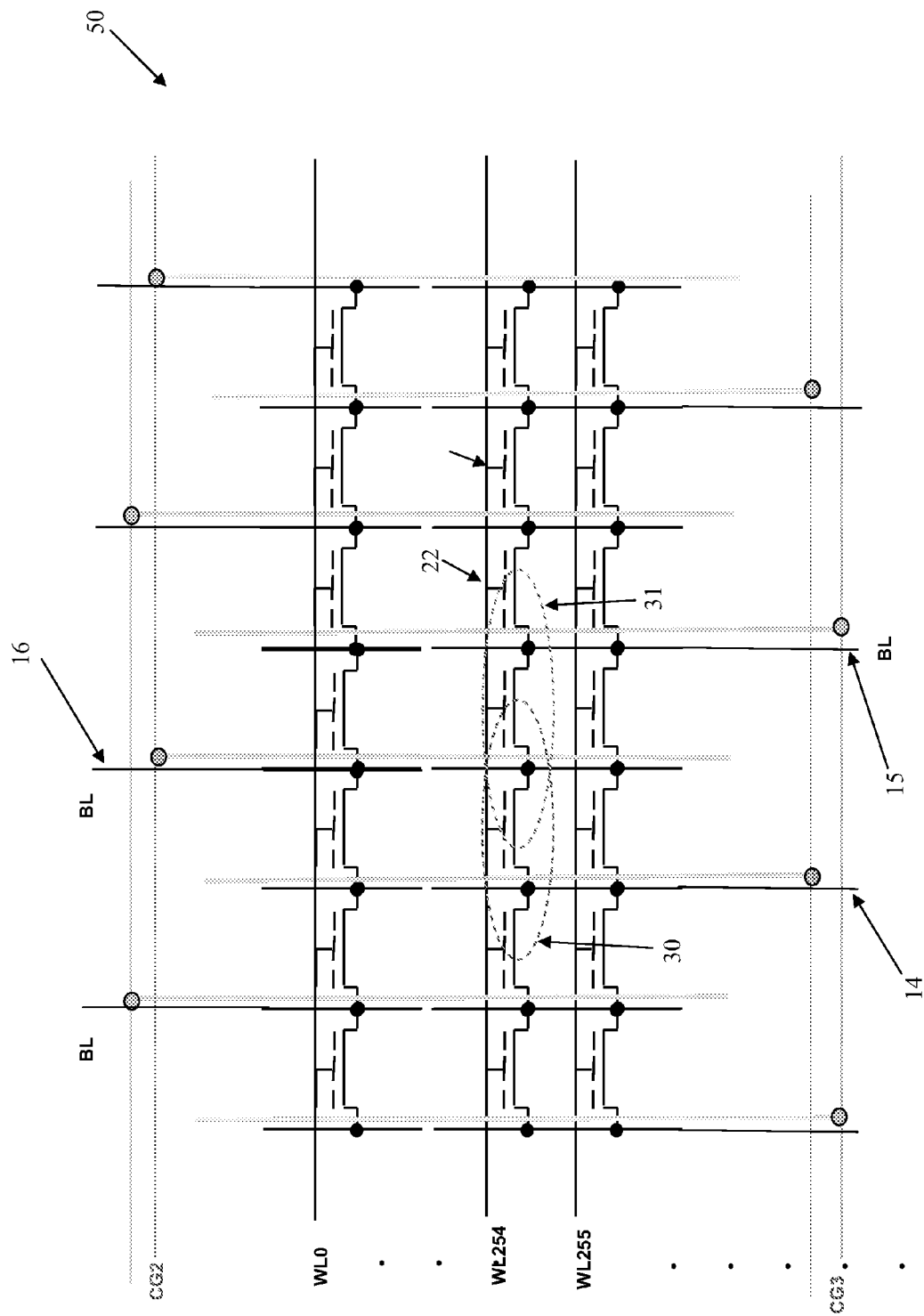
FIG. 3 is a schematic circuit diagram view of an AND array using a plurality of flash memory cells consistent with FIG. 2 and/or other aspects related to the innovations herein.

Referring to FIG. 3 there is shown a schematic diagram of an array 50 of AND flash memory structures 30. The array 50 comprises a plurality of AND flash memory structures 30 arranged in a plurality of rows and columns. As is well known to those in the art, the term row and column are used interchangeably, and should be read without limitation to the present invention. In the example illustrated in FIG. 3, each bi-directional AND flash memory structure 30 is arranged in the column direction, with a first source/drain region 14 at one end and a second source/drain region 16 at another end. These regions correspond to the bit lines defined by non-diffused junction regions laying under each column of control gates. Further, each AND flash memory structure 30 in a column shares a common source/drain regions 14 and 16 with adjacent AND flash memory structures in the column. Finally, as can be seen from FIG. 3, AND Flash memory structures that are adjacent to one another in the row direction also share a common source/drain region. Thus, for example, a first non-diffused region may act a source region for a first AND structure and as a source region for a second AND structure adjacent to the first in the same row. Referring to FIG. 3, a first exemplary AND structure 30 has a source region 14 and a drain region 16. The second AND structure 31 that is immediately adjacent to the first structure 30 shares the common drain region 16, while having a separate source region 15. Similarly, the source region 15 of the second AND structure may also be shared with yet a third, adjacent AND structure in that same row. Finally, the assist gates 22 are laid out in the row direction along their common word line (e.g. word line WL254), which may be perpendicular to the column of control gates 34.

Each assist gate associated with a word line acts as a conventional gate of an MOS transistor, in that a voltage applied to that gate can turn on the portion of the channel region underneath the gate. Each control gate 34 acts as a control gate of a stack floating gate transistor and controls two floating gates. The voltage applied to the control gate, if sufficient to overcome the charges stored on the associated floating gate, can turn on the portion of the channel region underneath the floating gate.

Figure 4A:
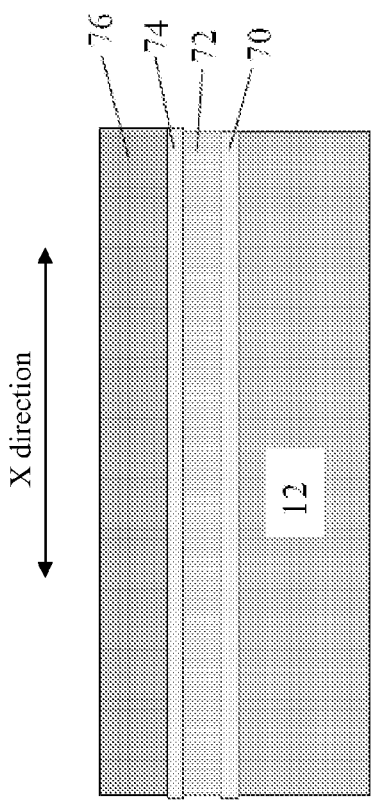
FIGS. 4a-4g show steps in making the portion of a flash memory cell consistent with FIG. 2 and/or other aspects related to the innovations herein.

The portion of the flash memory cell 30 shown in FIG. 2 can be made by the following process steps. Referring to FIG. 4A there is shown a single crystalline silicon substrate 12, on which is grown a layer of silicon dioxide 70. The layer of silicon dioxide may be about 90 Å in thickness. As will be apparent to those skilled in the art, the dimensions described herein are for a certain geometry size consistent with the disclosed structure 30. In the present case, the description is for a device having about 110 nm or below feature size. The layer of silicon dioxide 70 can be grown by thermal oxidation of silicon or it can be a deposited dielectric (e.g., by chemical vapor deposition or CVD). A layer of polysilicon 72 of about 300 Å is then deposited on the layer of silicon dioxide 70. The poly layer can be doped after deposition, or in-situ doped. The layer of polysilicon 72 can be deposited by low pressure chemical vapor deposition (LPCVD). The polysilicon 72 is then subjected to a high temperature oxidation (HTO) process, in which a layer of silicon dioxide 74 is formed. Approximately 130 Å in thickness of silicon dioxide 74 is formed. Finally, a layer of silicon nitride 76 of approximately 1400 Å in thickness is then deposited on the layer of silicon dioxide 74. The layer of silicon nitride 76 can be deposited by LPCVD. The resultant structure is shown in FIG. 4A. Of course, all of the forgoing described parameters and the parameters described hereinafter, depend upon the design rules and the process technology generation. What is described herein is for a 0.11 micron process. However, it will be understood by those skilled in the art that the present invention is not limited to any specific process technology generation, nor to any specific value in any of the process parameters described herein.

Once the oxide layer 70, the poly layer 72, the high temperature oxide 74, and the nitride layer 76 have been formed, suitable photo resist (masking) material is applied on the nitride layer 76 and a masking step is performed to selectively remove the photo resist material from certain regions. Where the photo resist material is removed, the underlying nitride layer 76, the poly layer 72, and the oxide layers 70 and 74 are left exposed in stripes formed in the Y or column direction. The distance between adjacent stripes can be as small as the smallest lithographic feature of the process used. Standard nitride, poly and oxide etching techniques (i.e. anisotropic etch processes) are then used to remove the exposed portions of nitride 76, poly 72 and oxide 70 and 74 in strip regions to form isolation trenches in the structure, leaving the substrate 12 exposed at the bottom of each isolation trench. The photo resist may then be removed.

A lithographic etch process is next performed, where suitable photo resist material is applied on the nitride layer 76, and a masking step is performed to selectively remove the photo resist material and selectively expose certain portions of nitride layer 76. An anisotropic nitride etch is then performed to remove the exposed portions of the nitride layer 76 and the high temperature oxide layer 74, thus creating trenches in the X direction that extend down to and selectively expose the poly layer 72.

Figure 4B:
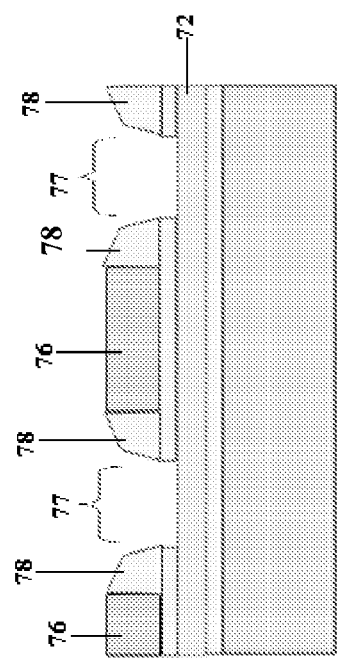
Figure 4C:
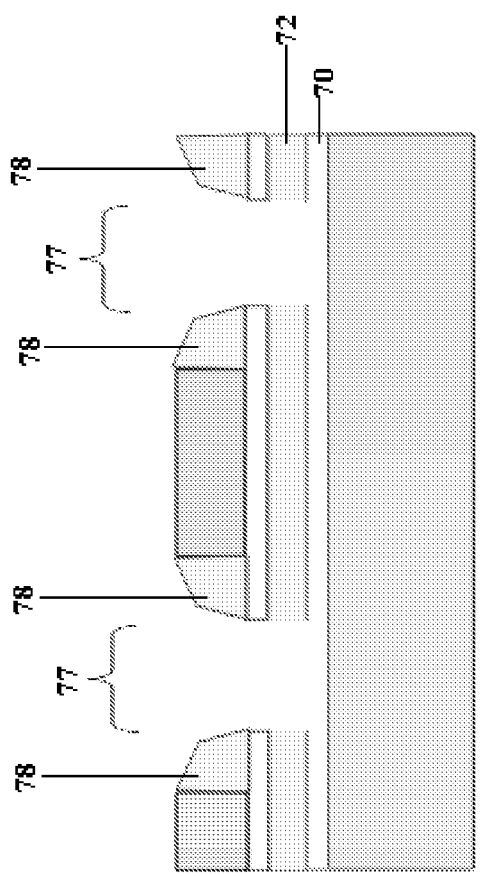

The next fabrication sequence is directed to the formation, in the X direction, of spacer elements or "spacers" 78 adjacent to the nitride regions remaining on the high temperature oxide layer 74. Formation of spacers is well known in the art, and involves the deposition of a material over the contour of a structure. Such deposition is generally followed by an anisotropic etch process, whereby the material is removed from horizontal surfaces of the structure, while the material remains largely intact on vertically oriented surfaces of the structure. This next fabrication sequence includes one of two alternate processes for spacer fabrication, either a process that forms an oxide spacer (e.g., TEOS) or a process that forms a poly spacer. The structures resulting from these alternate processes are shown in the illustrations of FIGS. 4B and 4C. Both aspects of spacer formation begin with well known masking steps, followed by different deposition and etching processes.

A first process directed to formation of oxide spacers comprises a TEOS deposition step and a TEOS etching step. Here, a layer of silicon dioxide 78 (TEOS) is deposited on the structure. The layer 78 of TEOS is about 1100 Å thick. The structure is then subjected to a TEOS etch (such as a reactive ion etch), stopping at the polysilicon layer 72. This operation results in the formation of spacers 78 made of TEOS that abut the unexposed strips of silicon nitride 76 and define troughs 77 between the spacers 78. The structure resulting from this first process is shown in FIG. 4B. An alternate process directed to formation of poly spacers comprises a polysilicon ("poly") deposition step, a poly etch step, and an oxide etch step. The alternate process begins with deposition of a poly layer over the substrate. Next, a poly etch step is performed to etch both this new poly layer, leaving spacers 78, as well as the lower poly layer 72 within the troughs 77. Finally, an oxide etch step is performed to etch away the lower oxide layer 70 remaining at the bottom of the troughs 77 between the spacers 78. The structure resulting from this alternate process is shown in FIG. 4C.

The structures formed by the two processes set forth above, shown in FIGS. 4B and 4C, are then subjected to an RIE polysilicon etch process. In the TEOS spacer process, this poly etch process removes the poly layer 72 remaining between the spacers in the trough. In the poly spacer process, this poly etch process is used to remove the poly spacers and expose the underlying silicon dioxide layer 70. The structure is then dipped in HF acid. In the process with TEOS spacers, this step removes the TEOS spacers 78 plus the underlying silicon dioxide layer 74. In the process with poly spacers that have now been etched away, this step removes the oxide layer 74 beneath the spacers and the oxide layer 70 at the bottom of the trough 77. The remaining structure is now again substantially identical as between the two alternate processes. A layer 80 of high temperature oxide is then deposited over the entire substrate. The resultant structure is shown in FIG. 4D.

Figure 4D:
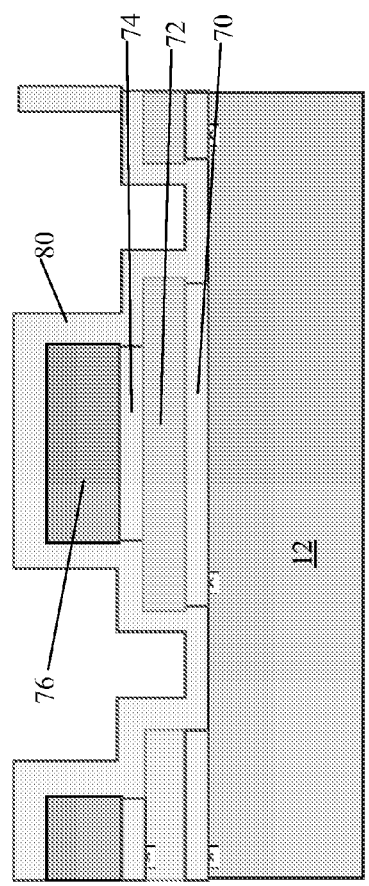

Polysilicon 82 is then deposited everywhere in the structure shown in FIG. 4D. In particular, polysilicon 82 is deposited in the regions between adjacent strips of silicon nitride 76, covered by the HTO oxide 80. The polysilicon 82 connects one row of cells to another across the isolation trench. The structure is then planarized and polished using CMP, removing the HTO oxide 80 on the silicon nitride 76, until the silicon nitride 76 is exposed and is planar with the exposed surface of the deposited polysilicon 82.

Figure 4E:
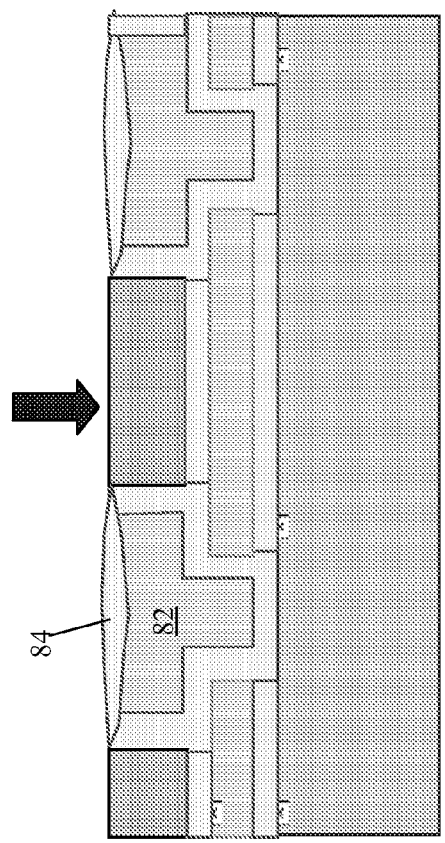
Figure 4F:
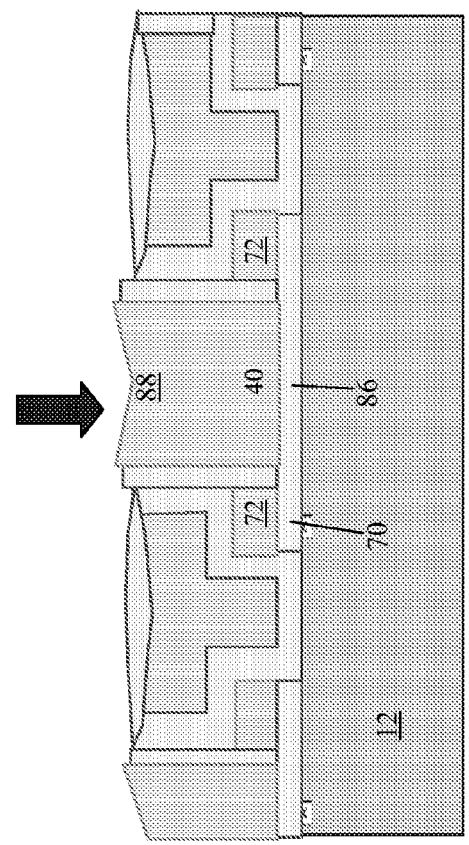
Figure 4G:
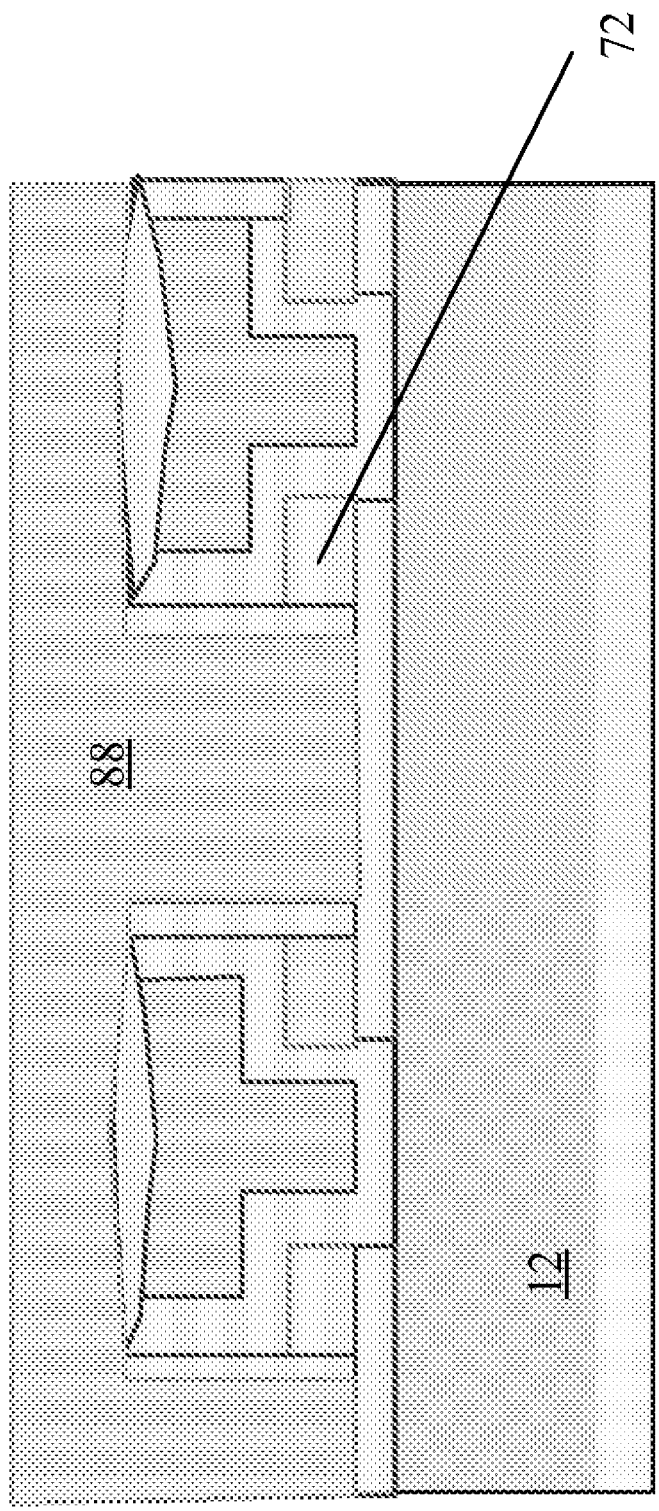

The structure is then oxidized. Since the only exposed polysilicon is that region of the polysilicon 82 which is exposed, oxide 84 is formed on the polysilicon 82. The structure is then dipped in HF acid. The resultant structure is shown in FIG. 4E. The structure shown in FIG. 4E is dipped in hot phosphoric acid which removes the exposed silicon nitride 76. The structure is then subjected to an RIE oxide etch removing the exposed portion of the silicon dioxide layer 74. The structure is then subjected to a RIE polysilicon etch removing exposed portions of the polysilicon 72, leaving two separate portions of polysilicon 72, which will be the pair of floating gates that are adjacent to the first assist gate. The structure is then subjected to an RIE oxide etch removing the exposed portions of the silicon dioxide layer 70, reaching the substrate 12. An oxide layer 86 is grown or deposited on the exposed silicon substrate 12, such as via an HTO process, forming an insulator for the word line (assist gate). The silicon dioxide layer 86 forms the gate oxide layer of the first assist gates. Accordingly, the thickness of the gate oxide 86 for the first assist gate 40 can be different from the gate oxide 70 for the floating gate 72. Finally, as shown in FIG. 4F, polysilicon 88 is deposited forming the first assist gate 40. The structure is then subjected to masking in the Y direction and poly etchback operations to finalize the word line structure. The resultant structure is shown in FIG. 4G.

Memory Cell Operation

The operation of the memory cells will now be described below with reference to FIGS. 5A-9B. The operation and theory of operation of such memory cells are also described in U.S. Pat. Nos. 5,572,054, 6,906,379, and 7,015,537, whose disclosure is incorporated herein by reference with regard to the operation and theory of operation of a non-volatile memory cells having floating gates, control gates, electron tunneling from the floating gates, and dual-storage-transistor arrays of memory cells formed thereby.

A selected memory cell can be erased via three modes, through the assist gate (hereafter "word line"), through the channel, and through the control gate. Aspects of erase operation may involve floating gates 64 and 68 having a "tip" on a corner edge near the region to which the electrons travel. The "tip," as disclosed in U.S. Pat. No. 5,029,130 facilitates the Fowler-Nordheim tunnel of electrons from the floating gates.

Figure 5A:
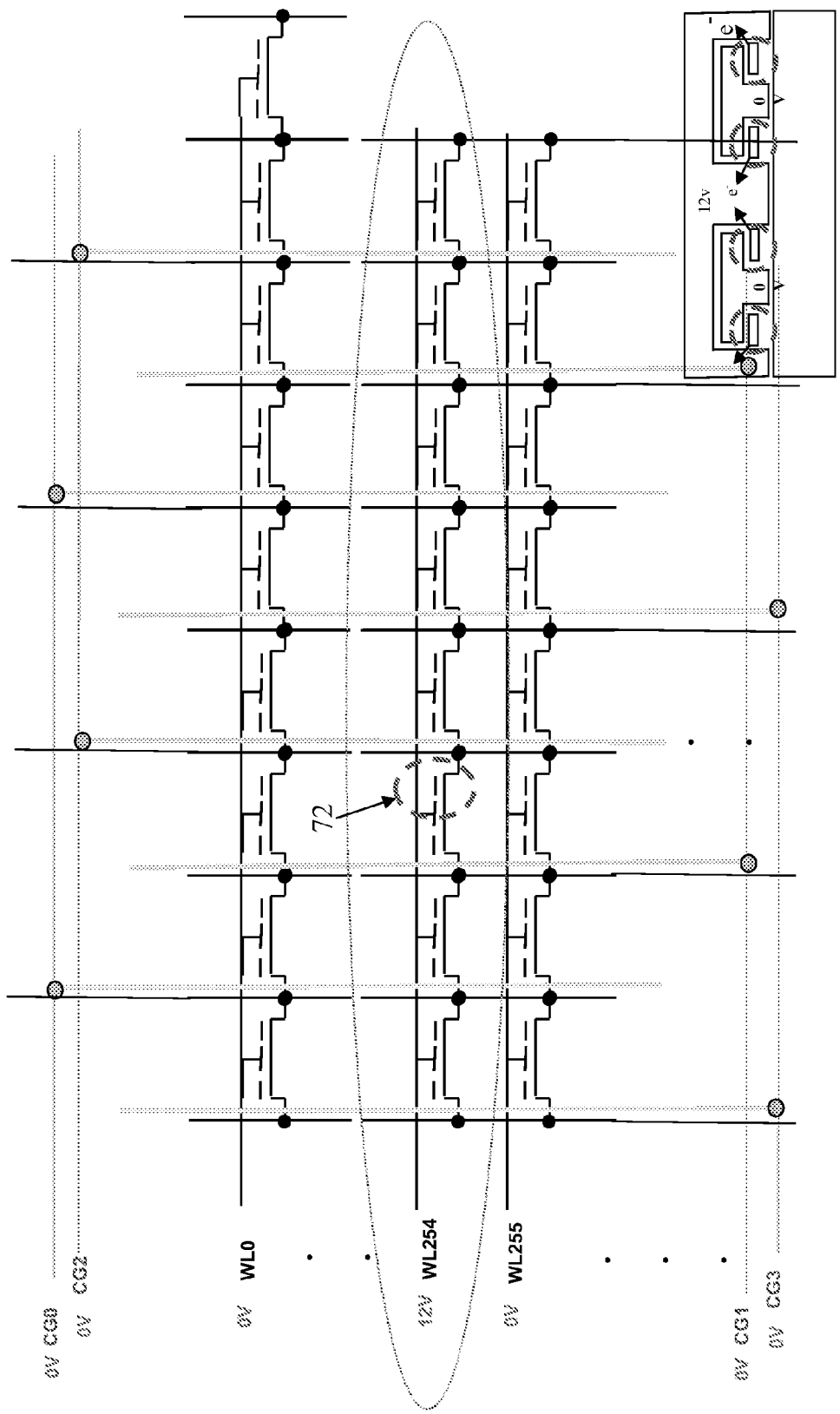
FIG. 5a is a schematic circuit diagram view of an AND array using a plurality of flash memory cells consistent with FIG. 2 and/or other aspects related to the innovations herein, showing an erase operation through the word line.
Figure 5B:
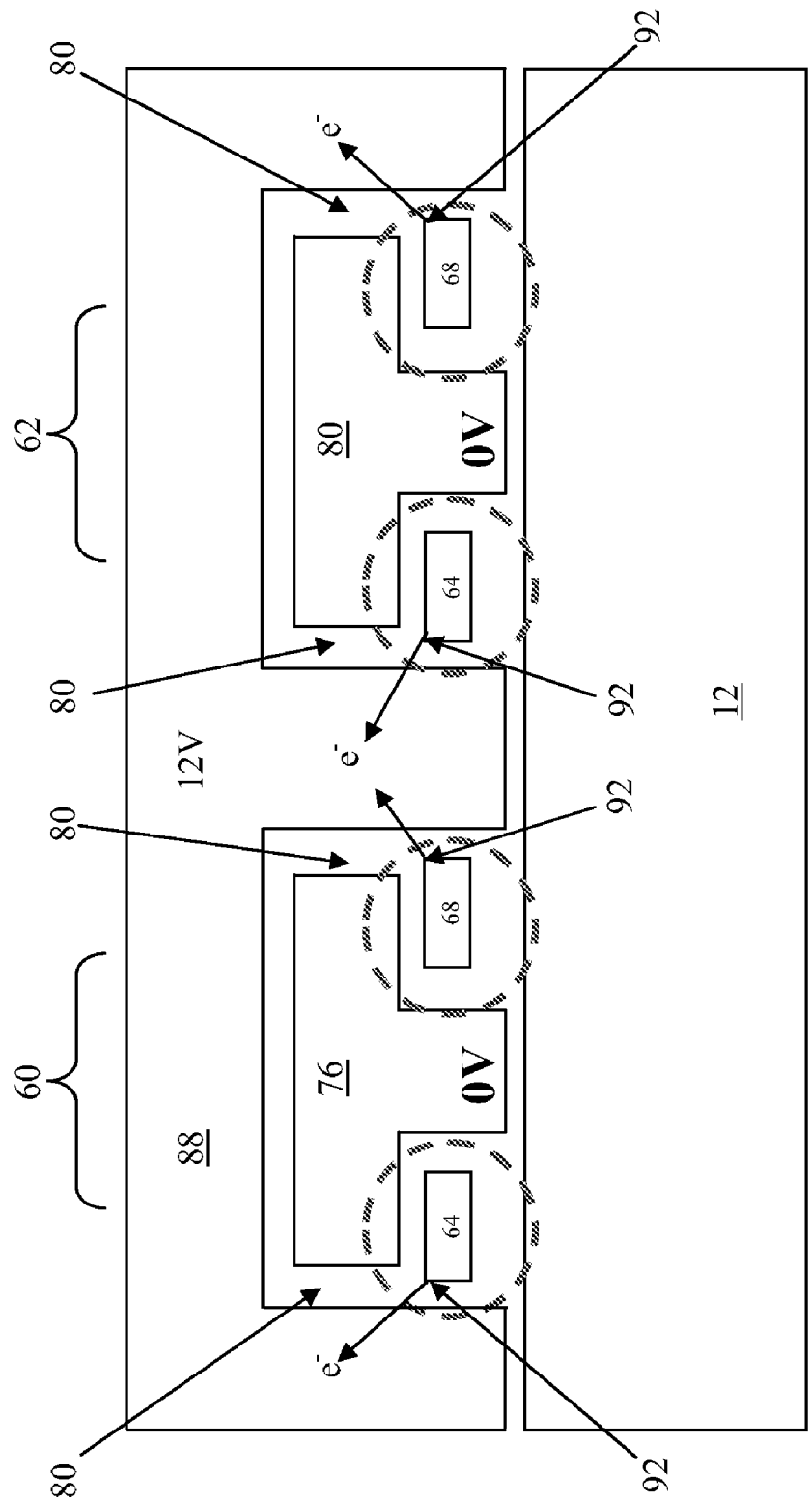
FIG. 5b is a cross-sectional view of a portion of a flash memory cell consistent with FIG. 2 and/or other aspects related to the innovations herein, showing an erase operation through the word line.

Referring to the first mode shown in FIGS. 5A-5B, to erase a cell through the word line, a ground or negative potential is applied to the control gates 76 and 80. A high positive voltage, on the order of +12 volts, is applied to the word line 84. As used herein, a high positive voltage is a positive voltage of magnitude sufficient, in the context of the surrounding structures and voltages, to induce Fowler-Nordheim tunneling of repelled electrons through the insulating layer adjacent the origin (floating gate), to the destination gate or node. Here, electrons on the floating gates 64 and 68 are induced through the Fowler-Nordheim tunneling mechanism to tunnel through the oxide layers 80 to the word line 88, leaving the floating gates 64 and 68 positively charged. Tunneling occurs from a corner edge or tip 92 formed on the floating gates 64 and 68. It should be noted that since the assist gate 88 runs along the length of the active regions, the entire row of memory cells (i.e. word line WL254 in FIG. 5A) in the selected active regions are "erased."

Figure 6A:
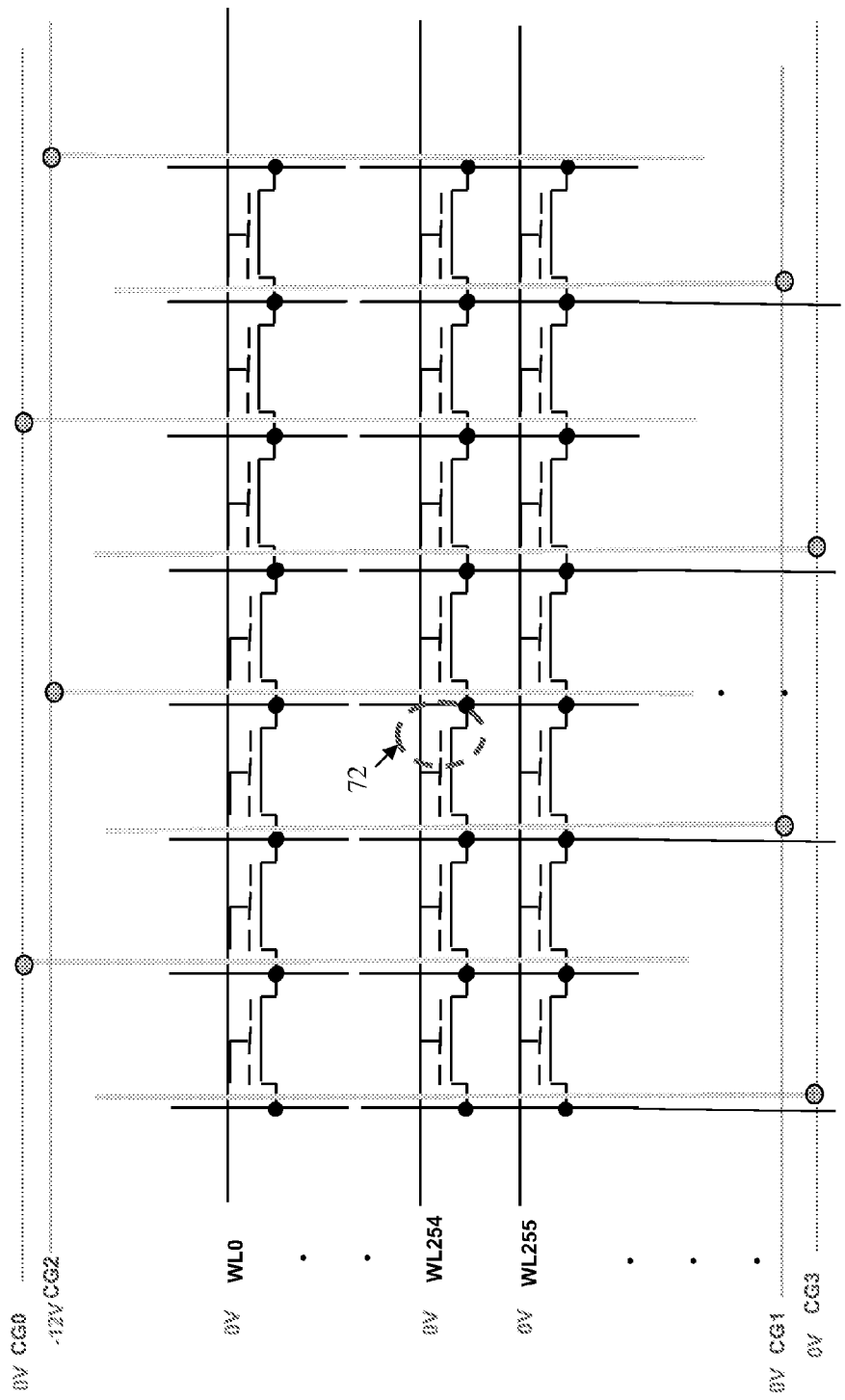
FIG. 6a is a schematic circuit diagram view of an AND array using a plurality of flash memory cells consistent with FIG. 2 and/or other aspects related to the innovations herein, showing an erase operation through the channel.
Figure 6B:
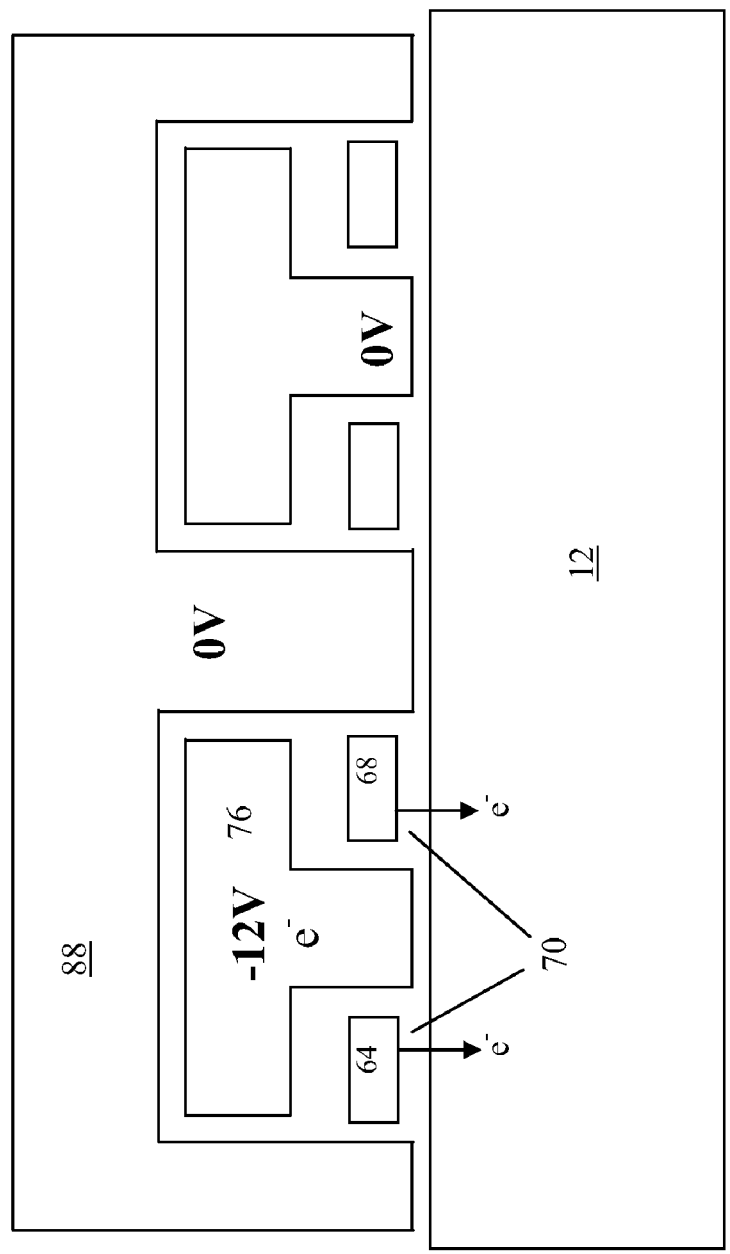
FIG. 6b is a cross-sectional view of a portion of a flash memory cell consistent with FIG. 2 and/or other aspects related to the innovations herein, showing an erase operation through the channel.

Referring to the second mode shown in FIGS. 6A-6B, to erase a cell through the channel, a high negative voltage, on the order of −12 volts, is applied to control gate 76. As used herein, a high negative voltage is a negative voltage of magnitude sufficient, in the context of the surrounding structures and voltages, to induce Fowler-Nordheim tunneling of attracted electrons through the insulating layer adjacent the origin (floating gate), onto the destination gate or node to which the electrons are drawn. A ground or 0 volts is applied to the word line 88. Electrons on the floating gates 64 and 68 are induced through the Fowler-Nordheim tunneling mechanism to tunnel through the oxide layer 70 to the channel region of the substrate 12, leaving the floating gates 64 and 68 positively charged. Again, the entire row of memory cells in the selected active regions are 'erased'.

Figure 7A:
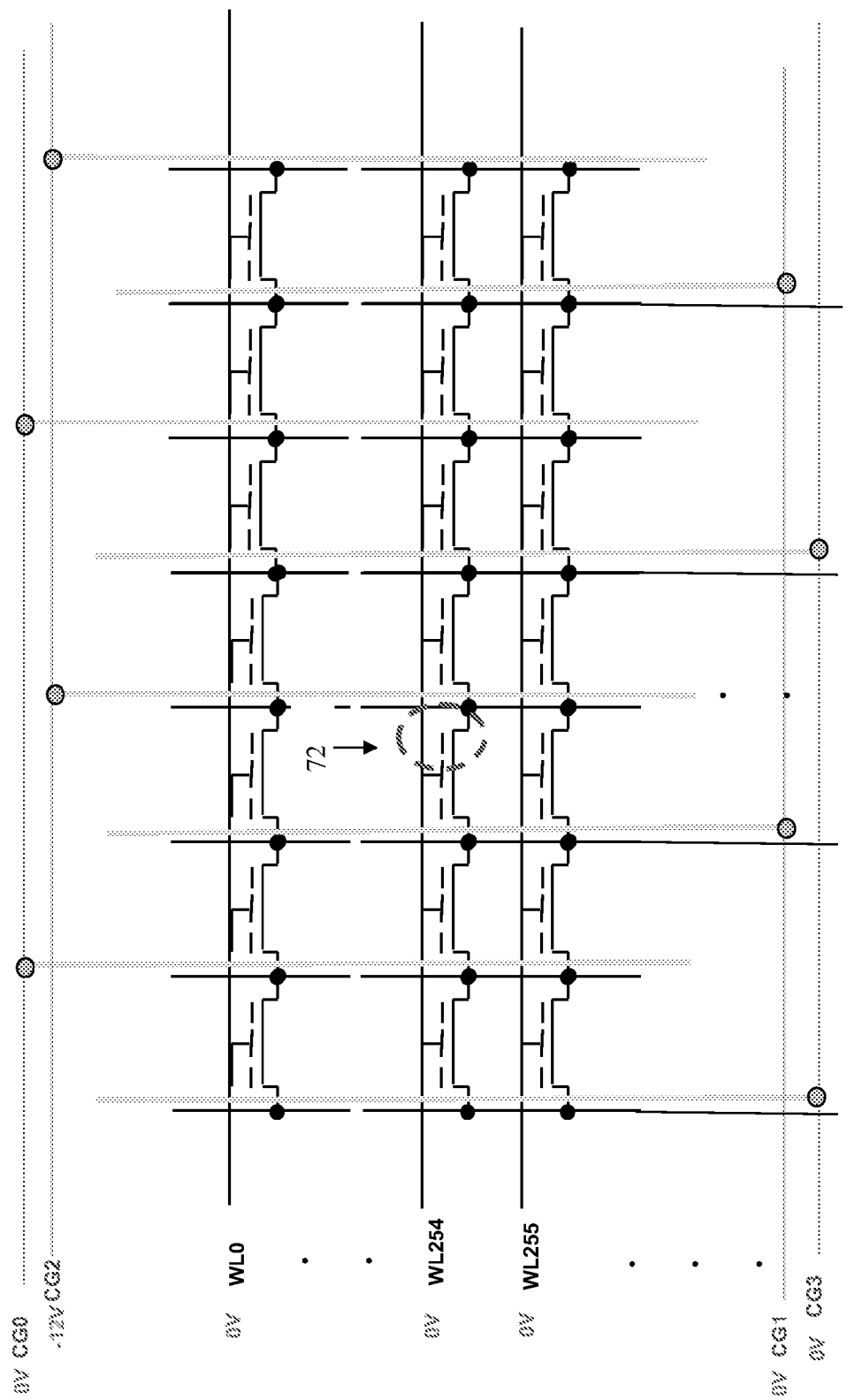
FIG. 7a is a schematic circuit diagram view of an AND array using a plurality of flash memory cells consistent with FIG. 2 and/or other aspects related to the innovations herein, showing an erase operation through the control gate.
Figure 7B:
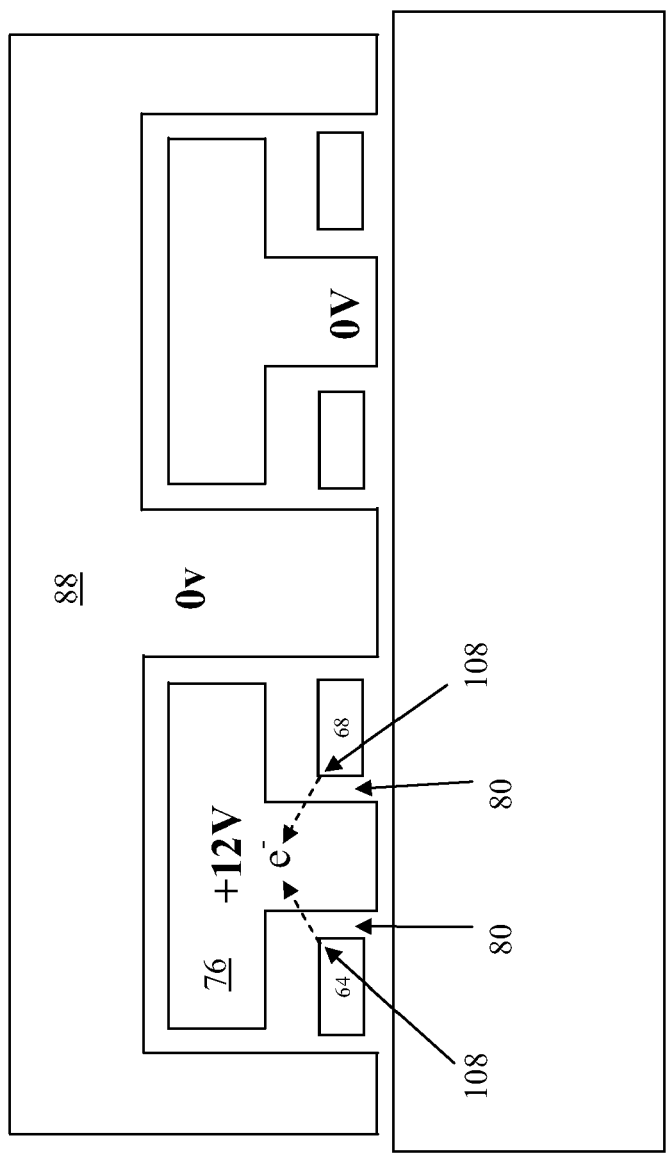
FIG. 7b is a cross-sectional view of a portion of a flash memory cell consistent with FIG. 2 and/or other aspects related to the innovations herein, showing an erase operation through the control gate.

Referring to the third mode shown in FIGS. 7A-7B, to erase a cell through the control gate, a high positive voltage, on the order of +12 volts, is applied to the control gate 76. A ground or negative voltage is applied to the word line 88. Electrons on the floating gates 64 and 68 are induced through the Fowler-Nordheim tunneling mechanism to tunnel through the oxide layer 80 to the control gate 76, leaving the floating gates 64 and 68 positively charged. Tunneling occurs from the corner edges 108 on the floating gates 64 and 68. This method is less preferred because of high coupling capacitances between the control gate and the floating gates. Again, an entire column can be "erased."

Figure 8A:
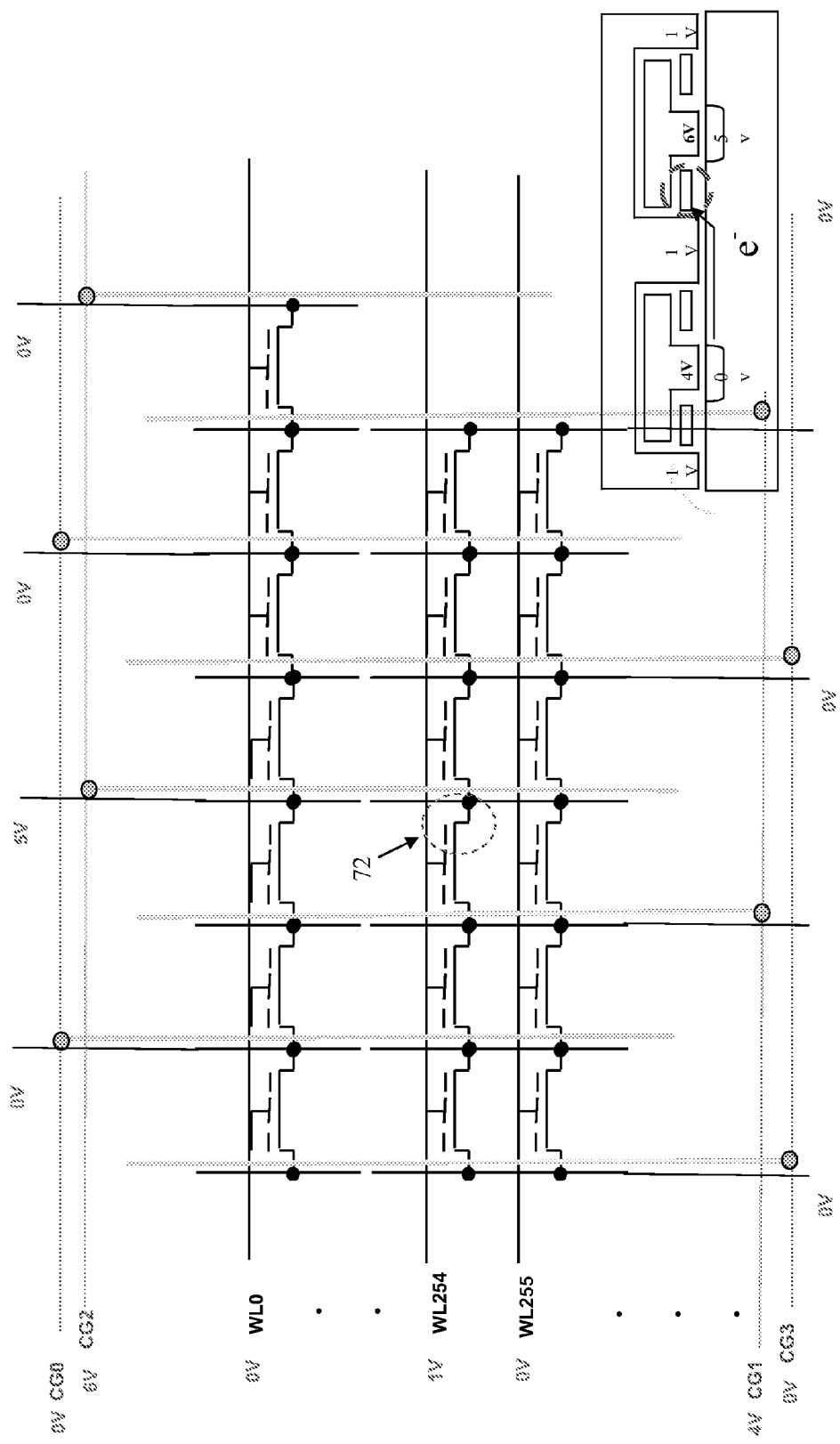
FIG. 8a is a schematic circuit diagram view of an AND array using a plurality of flash memory cells consistent with FIG. 2 and/or other aspects related to the innovations herein, showing a program operation.
Figure 8B:
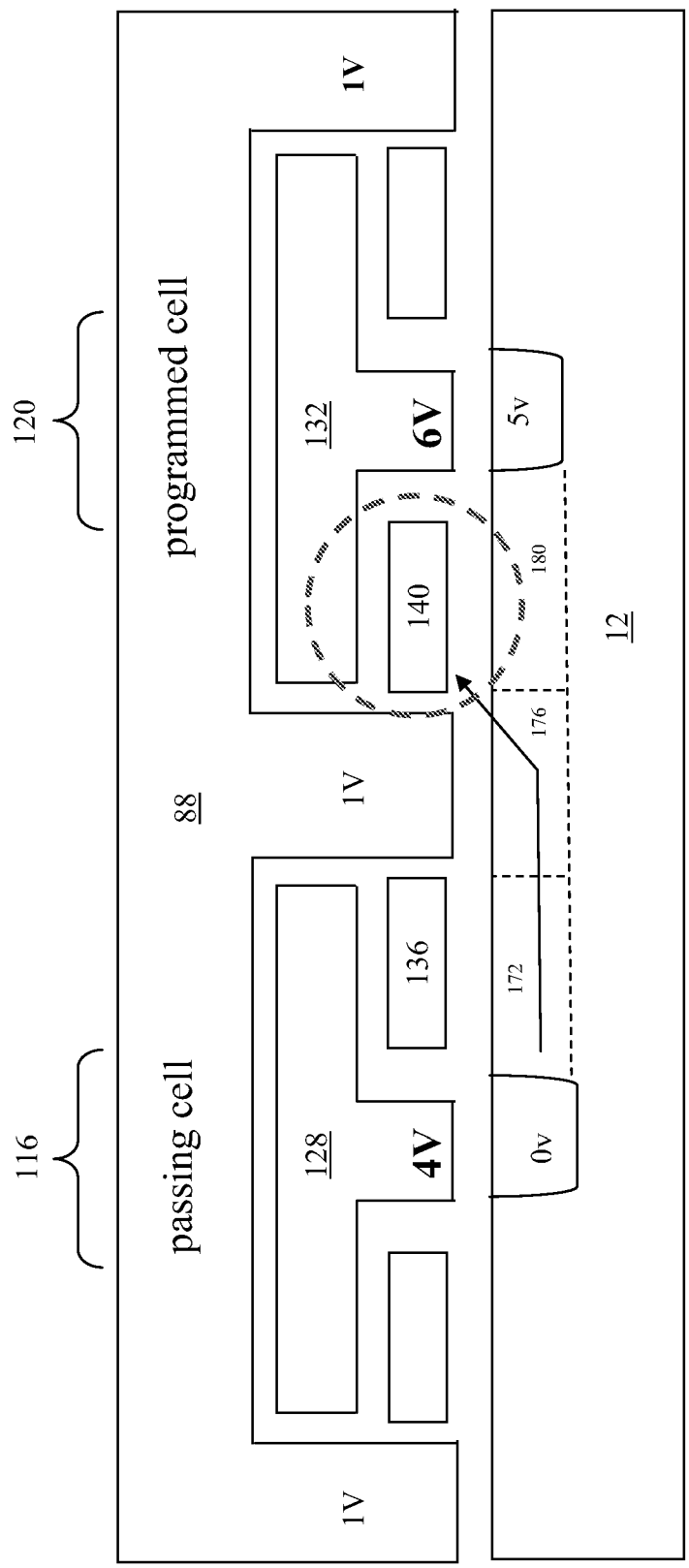
FIG. 8b is a cross-sectional view of a portion of a flash memory cell consistent with FIG. 2 and/or other aspects related to the innovations herein, showing a program operation.

A program operation for a selected memory cell is shown in FIGS. 8A-8B. For purposes of explanation, let us assume that the second cell element 120 (herein "programmed cell") of the memory cell is to be programmed by use of the first cell element 116 (herein "passing cell"). To program a selected memory cell, the selected word line 88 is supplied with a small positive voltage such as +1 volt while the unselected word lines may be held at ground. The control gate 132 of the transistor in the programmed cell 120 is supplied with 6 volts. To operate the programmed cell 120, the control gate 128 transistor in the passing cell 116 must be held high enough (~4 volts) to couple enough voltage to the floating gate 136. The floating gate 136 then induces a channel and electron flow in the substrate, which injects the electrons (e.g., via hot-electron injection) to program or turn on the floating gate 140 within the programmed cell 120.

In operation, the voltage, such as +1 volts, supplied to the selected word line 88 is sufficient to turn on the channel region of the storage transistors in all of the memory cells in the same row, accessed by the selected word line 88. Since the gate 128 of the passing cell control transistor is supplied with sufficient voltage (~4 volts), it will be turned on and it will control the current passing through that transistor. The electron flow in the induced channel region near the top planar surface of the substrate 12 directly underneath the control gate 128 will travel towards the floating gate 136. Since the floating gate 136 is highly capacitively coupled to the control gate 128 the floating gate 136 is also set at high or 'on' voltage. This high voltage is sufficient to cause the electrons in the induced channel region underneath the control gate 128 to continue traveling under the floating gate 136 and through the substrate 12 to the programmed cell 120. This current flow within the substrate 12 is illustrated in FIG. 8B, which shows electron travel across first 172, second 176, and third 180 channel regions of the substrate 12 between the two cells. Accordingly, the selected transistors thereby enable their respective storage elements or gates (i.e., floating gate 140) to be turned 'on'. However, since any unselected transistors are held at zero volts, their respective memory cells will not be programmed.

Figure 9A:
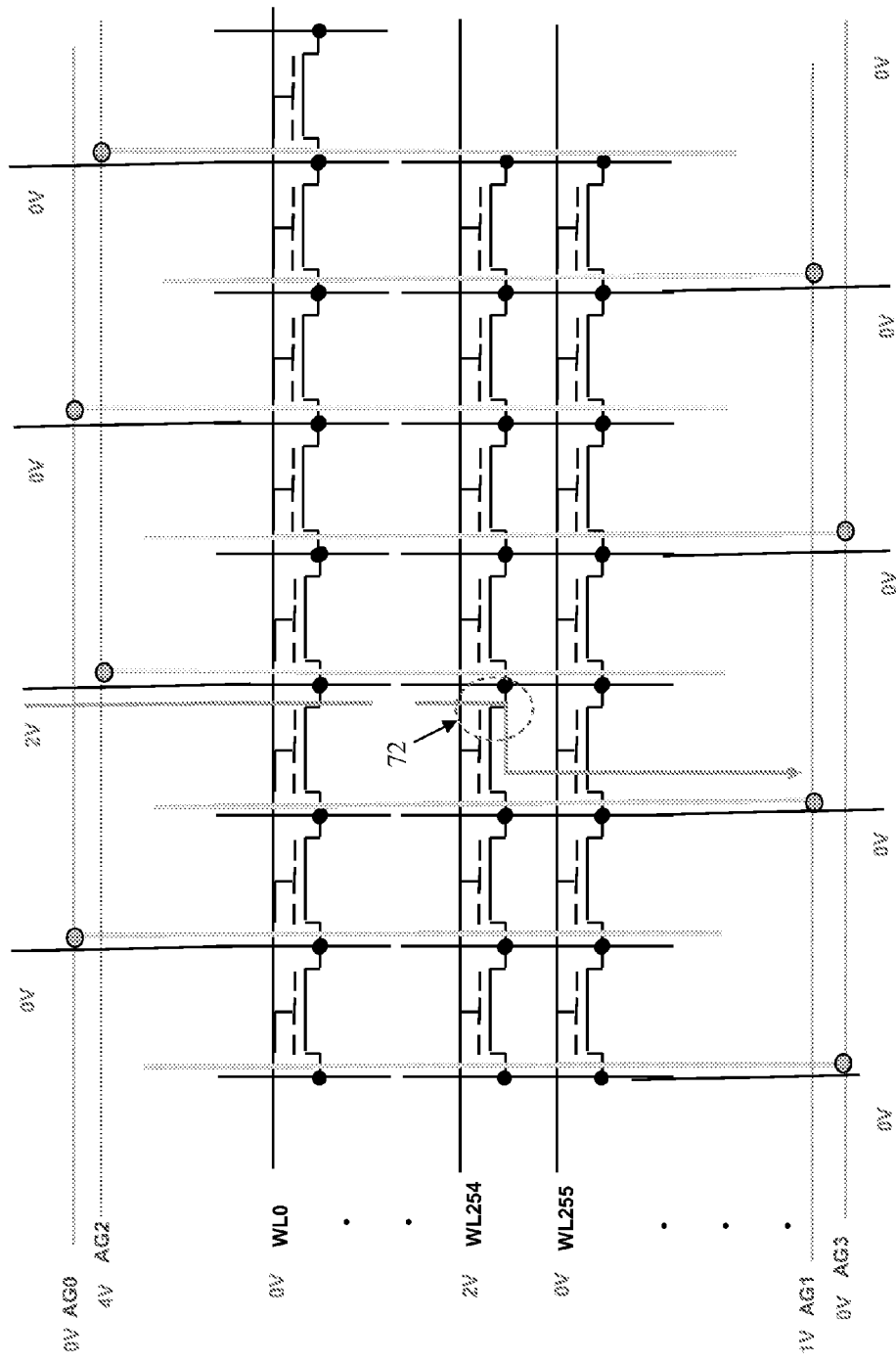
FIG. 9a is a schematic circuit diagram view of an AND array using a plurality of flash memory cells consistent with FIG. 2 and/or other aspects related to the innovations herein, showing a read operation.
Figure 9B:
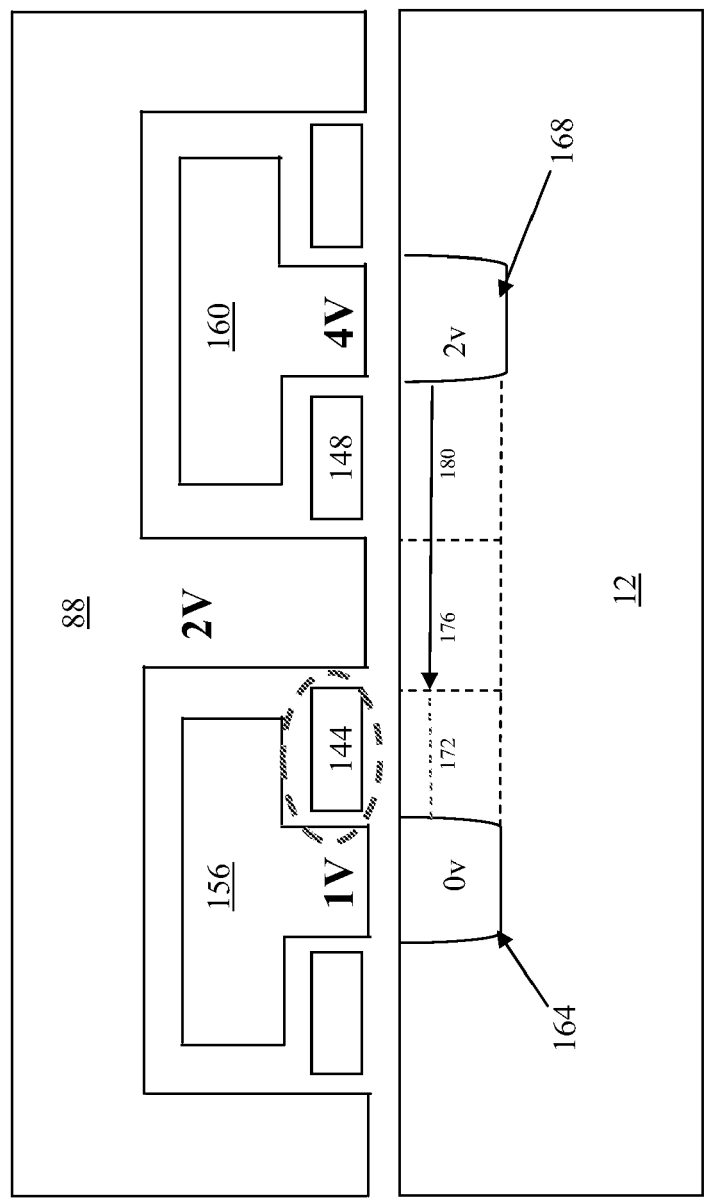
FIGS. 9b-9c are a cross-sectional views a portion of a flash memory cell consistent with FIG. 2 and/or other aspects related to the innovations herein, showing read operations.
Figure 9C:
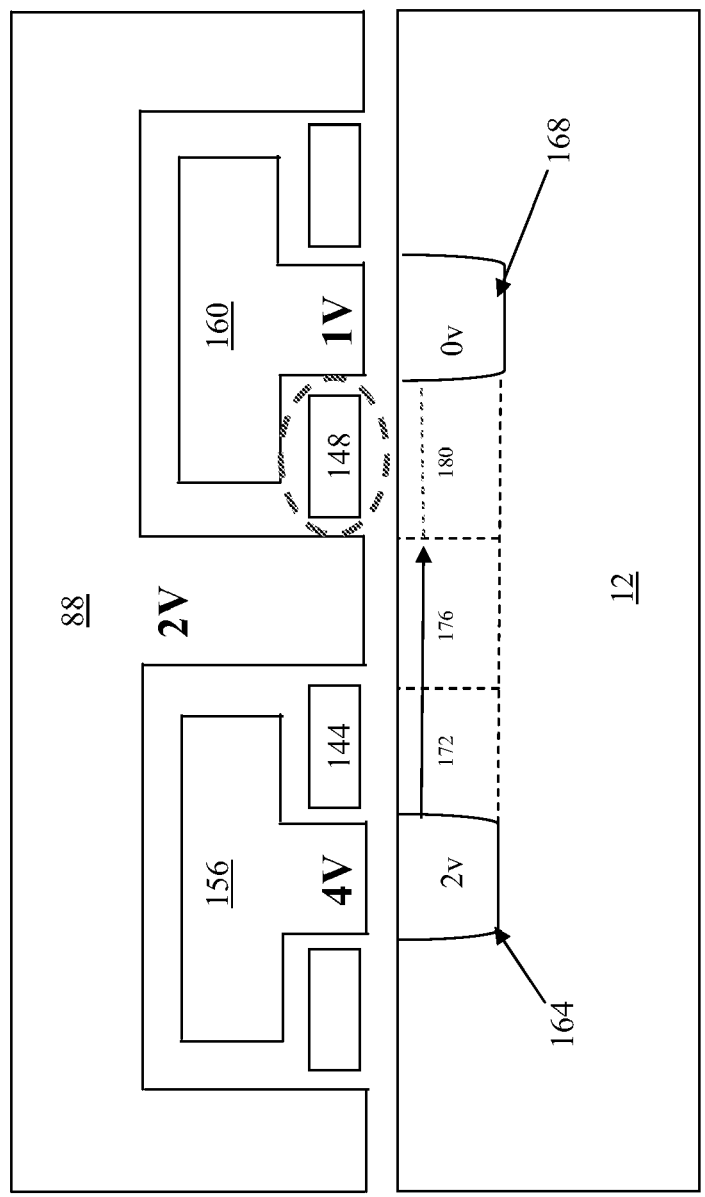

Exemplary read operations for a selected memory cell 72 are shown in FIGS. 9A-9C. To read the memory cell, voltages are applied to the first control gate 156, the second control gate 160, and the word line 88. Reading of the cell can occur in one of two mechanisms: either the state of the first floating gate 144 is read, or the state of the second floating gate 148 is read. Let us first discuss the action of reading the state of the first floating gate 144, i.e., whether electrons are stored on the first floating gate 144. The first control gate 156 is held at a positive voltage of 1 volts. The word line is held at a positive voltage of 2 volts. The second control gate 160 is held at a positive voltage of 4 volts. A positive (cell programmed) read will occur if a channel is induced across the first 172, second 176, and third 180 regions of the substrate 12 between the two cells. The positive voltage of 4 volts on the second control gate 160 is sufficient to turn on the third portion 180 of the induced channel region, regardless of whether the second floating gate 148 is programmed. The positive voltage of 2 volts on the word line 88 is sufficient to 'turn on' the second portion 176 of the non-diffused channel region. The positive voltage of 1 volt on the first control gate 156 is sufficient to turn on the first portion of the induced channel region only if the first floating gate 144 is programmed. In that event, electrons will traverse all full width of the induced channel region, producing a positive read. However, if the first floating gate 144 is not programmed, then the positive voltage of 1 volt is not sufficient to turn on the first portion 172 of the channel region. In that event, the full width of the substrate between bit lines is not induced and the channel remains non-conductive to electron flow. Thus, the amount of current or the presence/absence of current sensed between the bit lines is indicative of the state of programming of the first floating gate 144.

To read the second floating gate 148, the voltages applied to the first control gate 156 and the second control gate 160 are reversed from those applied as set forth above. Similarly, then, the amount of current or the presence/absence of current sensed between the bit lines is indicative of the state of programming of the second floating gate 148.

Alternate Aspects

Figure 10:
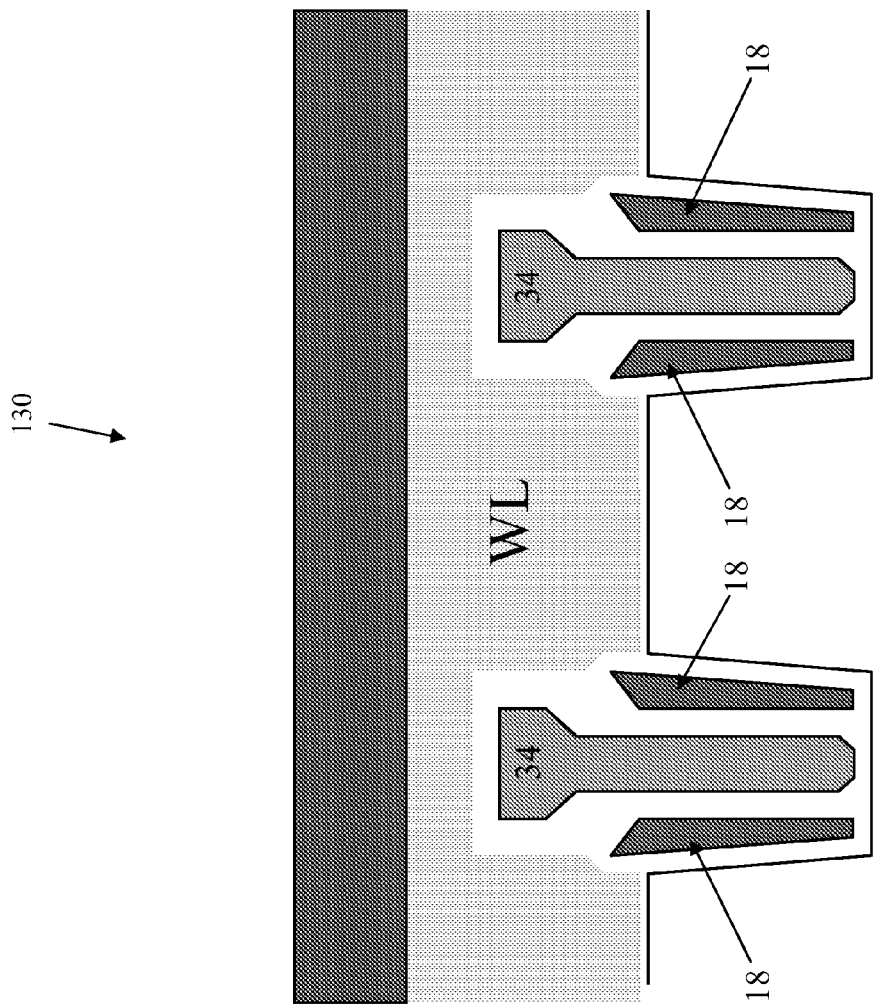
FIG. 10 is a schematic cross-sectional view illustrating additional features of a flash memory cell consistent with aspects related to the innovations herein.

Referring to FIG. 10, there is shown a cross sectional view of other aspects of a flash memory structure 130 of the present invention. The structure 130 is similar to the structure 30 shown and described in FIG. 2. The only difference between the structure 130 and the structure 30 is that the floating gates 18 and the associated control gate 34 are in a trench. In contrast, in the structure 30, all of the control gates, select gates, and floating gates are on the planar surface of the silicon substrate. The specific detail of the formation of the trench as well as the control gate 34 and floating gates 18 within the trench is fully disclosed in U.S. Patent Application Publication No. US2004/0196694A1, whose disclosure is incorporated herein by reference in its entirety. In particular, reference is made to FIGS. 1A-2P and the description thereof, which detail similar structures. While some specific electron travel in the flash memory structure 130 of FIG. 10 differs based on the differing shape and location of nodes, the overall theory and operation remain as set forth above.

As can be seen from the foregoing, a bi-directional high density AND flash memory structure and array comprised of split gate memory cells is disclosed.

It is to be understood that the foregoing description is intended to illustrate and not to limit the scope of the invention, which is defined by the scope of the appended claims. Other embodiments are within the scope of the following claims.

What is claimed is:

1. A flash memory structure formed on a semiconductor substrate of a first conductivity type, the structure comprising:
    a non-diffused channel region within the semiconductor substrate through which electron flow may be induced by application of voltage to gate elements disposed above the channel region;
    a plurality of floating gates, spaced apart from one another, each insulated from the channel region;
    a plurality of T-shaped control gates, spaced apart from one another, each insulated from the channel region, each control gate being laterally adjacent a first floating gate in position across form the channel region, and being capacitively coupled to the first floating gate, wherein each control gate and the first floating gate to which the control gate is capacitively coupled form a subcell; and
    a plurality of assist gates, spaced apart from one another, each insulated from the channel region, each assist gate being between and insulated from a first subcell and a second subcell, wherein each assist gate being between a floating gate in the first subcell and a floating gate in the second subcell;
    wherein the channel region includes a first channel region beneath the first subcell, a second channel region beneath the second subcell, and a third channel region beneath the assist gate, and wherein each subcell and each assist gate control conductivity of a channel region located therebeneath; and
    wherein operation of the second subcell as a programmed cell is enabled via electron flow induced in the first channel region, the second channel region, and the third channel region by voltages on the first floating gate associated with the first control gate, the assist gate, and the second control gate, respectively.

2. The structure of claim 1 wherein each floating gate is between a control gate and an assist gate.

3. The structure of claim 1 wherein each floating gate within the first subcell is immediately adjacent the first channel region and each floating gate with the second subcell is immediately adjacent the second channel region.

4. The structure of claim 1 wherein each floating gate is immediately adjacent a channel region associated with the subcell in which the floating gate is located.

5. The structure of claim 3 wherein the floating gate is disposed adjacent the substrate, a control gate, and an assist gate, and insulated therefrom with insulation material having a thickness that permits Fowler-Nordheim tunneling.

6. The structure of claim 1 wherein the first T-shaped control gate is part of a passing cell and the second T-shaped control gate is part of a programmed cell.

7. The structure of claim 6 wherein each control gate includes a lower portion immediately adjacent the channel region and two upper portions.

8. The structure of claim 7 wherein each floating gate is located between an upper portion of a control gate and the channel region.

9. The structure of claim 7 wherein each upper portion is immediately adjacent to one of the floating gates to which the control gate is capacitively coupled.

10. The structure of claim 1 wherein the channel region defines a path for one or both of reading or programming a floating gate.

11. The structure of claim 1 wherein each control gate is in a trench capacitively coupled to first and second floating gates in the trench.

12. The structure of claim 11 wherein the first T-shaped control gate is part of a passing cell and the second T-shaped control gate is part of a programmed cell.

13. The structure of claim 10 wherein the floating gates are positioned along sidewalls of the trenches.

14. The structure of claim 1, each control gate being between the first floating gate and a second floating gate, and being capacitively coupled to the second floating gate, wherein each subcell further comprises the second floating gate.

15. The structure of claim 5 wherein each floating gate is between a control gate and an assist gate.

16. The structure of claim 2 wherein each floating gate within the first subcell is immediately adjacent the first channel region and each floating gate with the second subcell is immediately adjacent the second channel region.

17. The structure of claim 2 wherein each floating gate is immediately adjacent a channel region associated with the subcell in which the floating gate is located.

18. The structure of claim 16 wherein the floating gate is disposed adjacent the substrate, a control gate, and an assist gate, and insulated therefrom with insulation material having a thickness that permits Fowler-Nordheim tunneling.

19. The structure of claim 2 wherein the first T-shaped control gate is part of a passing cell and the second T-shaped control gate is part of a programmed cell.

20. The structure of claim 19 wherein each control gate includes a lower portion immediately adjacent the channel region and two upper portions.

21. The structure of claim 20 wherein each floating gate is located between an upper portion of a control gate and the channel region.

22. The structure of claim 20 wherein each upper portion is immediately adjacent to one of the floating gates to which the control gate is capacitively coupled.

23. The structure of claim 2 wherein the channel region defines a path for one or both of reading or programming a floating gate.

24. The structure of claim 2 wherein each control gate is in a trench capacitively coupled to first and second floating gates in the trench.

25. The structure of claim 24 wherein the first T-shaped control gate is part of a passing cell and the second T-shaped control gate is part of a programmed cell.

26. The structure of claim 23 wherein the floating gates are positioned along sidewalls of the trenches.

27. The structure of claim 2, each control gate being between the first floating gate and a second floating gate, and being capacitively coupled to the second floating gate, wherein each subcell further comprises the second floating gate.

28. The structure of claim 14 wherein each floating gate within the first subcell is immediately adjacent the first channel region and each floating gate with the second subcell is immediately adjacent the second channel region.

29. The structure of claim 14 wherein each floating gate is immediately adjacent a channel region associated with the subcell in which the floating gate is located.

30. The structure of claim 3 wherein each floating gate is immediately adjacent a channel region associated with the subcell in which the floating gate is located.

31. The structure of claim 3 wherein the first T-shaped control gate is part of a passing cell and the second T-shaped control gate is part of a programmed cell.

32. The structure of claim 31 wherein each control gate includes a lower portion immediately adjacent the channel region and two upper portions.

33. The structure of claim 32 wherein each floating gate is located between an upper portion of a control gate and the channel region.

34. The structure of claim 32 wherein each upper portion is immediately adjacent to one of the floating gates to which the control gate is capacitively coupled.

35. The structure of claim 3 wherein the channel region defines a path for one or both of reading or programming a floating gate.

36. The structure of claim 3 wherein each control gate is in a trench capacitively coupled to first and second floating gates in the trench.

37. The structure of claim 36 wherein the first T-shaped control gate is part of a passing cell and the second T-shaped control gate is part of a programmed cell.

38. The structure of claim 35 wherein the floating gates are positioned along sidewalls of the trenches.

39. The structure of claim 3, each control gate being between the first floating gate and a second floating gate, and being capacitively coupled to the second floating gate, wherein each subcell further comprises the second floating gate.

40. The structure of claim 4 wherein each floating gate is immediately adjacent a channel region associated with the subcell in which the floating gate is located.

41. The structure of claim 4 wherein the first T-shaped control gate is part of a passing cell and the second T-shaped control gate is part of a programmed cell.

42. The structure of claim 41 wherein each control gate includes a lower portion immediately adjacent the channel region and two upper portions.

43. The structure of claim 42 wherein each floating gate is located between an upper portion of a control gate and the channel region.

44. The structure of claim 4 wherein the channel region defines a path for one or both of reading or programming a floating gate.

45. The structure of claim 4 wherein each control gate is in a trench capacitively coupled to first and second floating gates in the trench.

46. The structure of claim 4, each control gate being between the first floating gate and a second floating gate, and being capacitively coupled to the second floating gate, wherein each subcell further comprises the second floating gate.

* * * * *